(12) United States Patent
Hong

(10) Patent No.: US 7,115,923 B2
(45) Date of Patent: Oct. 3, 2006

(54) IMAGING WITH GATE CONTROLLED CHARGE STORAGE

(75) Inventor: Sungkwon C. Hong, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/645,552

(22) Filed: Aug. 22, 2003

(65) Prior Publication Data

US 2005/0040393 A1   Feb. 24, 2005

(51) Int. Cl.
*H01L 27/148* (2006.01)
(52) U.S. Cl. ............... 257/290; 257/291; 257/293; 257/258; 257/215; 257/387
(58) Field of Classification Search ............... 257/290, 257/291, 293, 258, 215, 387
See application file for complete search history.

(56) References Cited

U.S. PATENT DOCUMENTS 5,047,818 A * 9/1991 Tsukamoto ............... 257/297
5,476,808 A * 12/1995 Kusaka et al. ............ 438/75
6,091,793 A   7/2000 Kamashita
2001/0022371 A1 * 9/2001 Rhodes ..................... 257/290

FOREIGN PATENT DOCUMENTS

EP   0 809 303 A1   11/1997
WO   WO 97/28588   8/1997

OTHER PUBLICATIONS

Huat Aw Ch et al.—"A 128 × 128-Pixel Standard-CMOS Image Sensor with Electronic Shutter," IEEE Journal of Solid-State Circuits, IEEE Inc. New York, vol. 31, No. 12, Dec. 1996, pp. 1922-1930.
International Search Report dated Apr. 7, 2005.

* cited by examiner

*Primary Examiner*—Long Pham
(74) *Attorney, Agent, or Firm*—Dickstein Shapiro LLP

(57) ABSTRACT

A pixel cell comprises a photo-conversion device for generating charge and a gate controlled charge storage region for storing photo-generated charge under control of a control gate. The charge storage region can be a single CCD stage having a buried channel to obtain efficient charge transfer and low charge loss. The charge storage region is adjacent to a gate of a transistor. The transistor gate is adjacent to the photo-conversion device and, in conjunction with the control gate, transfers photo-generated charge from the photo-conversion device to the charge storage region.

5 Claims, 9 Drawing Sheets

IMAGING WITH GATE CONTROLLED CHARGE STORAGE

FIELD OF THE INVENTION

The present invention relates to the field of semiconductor devices, particularly to an improved pixel cell for efficient charge transfer and low charge loss.

BACKGROUND OF THE INVENTION

Complementary metal oxide semiconductor (CMOS) image sensors are increasingly being used over charge coupled device (CCD) image sensors as low cost imaging devices. A typical single chip CMOS image sensor 199 is illustrated by the block diagram of FIG. 1. Pixel array 190 comprises a plurality of pixels 200, which are described below, arranged in a predetermined number of columns and rows.

Typically, the rows of pixels in array 190 are read out one by one. Accordingly, pixels in a row of array 190 are all selected for readout at the same time by a row select line, and each pixel in a selected row provides a signal representative of received light to a readout line for its column. In array 190, each column also has a select line, and the pixels of each column are selectively read out in response to the column select lines.

The row lines in pixel array 190 are selectively activated by a row driver 191 in response to row address decoder 192. The column select lines are selectively activated by a column driver 193 in response to column address decoder 197. The pixel array is operated by the timing and control circuit 195, which controls address decoders 192, 197 for selecting the appropriate row and column lines for pixel signal readout.

The signals on the column readout lines typically include a pixel reset signal ($V_{rst}$) and a pixel image signal ($V_{sig}$) for each pixel. Both signals are read into a sample and hold circuit (S/H) 196 in response to the column driver 193. A differential signal ($V_{rst}-V_{sig}$) is produced by differential amplifier (AMP) 194 for each pixel, and each pixel's differential signal is amplified and digitized by analog to digital converter (ADC) 198. The analog to digital converter 198 supplies the digitized pixel signals to an image processor 189 which can perform appropriate image processing before providing digital signals defining an image.

An electronic shutter for image sensors has been developed to serve in place of a mechanical shutter. The electronic shutter controls the amount of photo-generated charge accumulated by a pixel cell by controlling the integration time of the pixel cell. This feature is especially useful when imaging moving subjects, or when the image sensor itself is moving and shortened integration time is necessary for quality images.

Typically a pixel cell having an electronic shutter includes a shutter transistor and a storage device, which is typically a pn-junction capacitor. The storage device stores a voltage representative of the charge generated by a photo-conversion device in the pixel cell. The shutter transistor controls when and for how long charge is transferred to the storage device and therefore, controls the integration time of the pixel cell.

There are two typical modes of operation for an electronic shutter: rolling and global. When an electronic shutter operations as a rolling shutter, each row of pixels in an array integrates photo-generated charge one at a time, and each row is read out one at a time. When an electronic shutter operates as a global shutter, all pixels of an array integrate photo-generated charge simultaneously, and each row is read out one at a time.

Global shuttering provides advantages over row shuttering. Essentially, global operation is able to provide a "snap shot" of the imaged subject. Consequently, global operation offers increased accuracy of an imaged subject and a uniform exposure time and image content.

On the other hand, because the pixel cells of the pixel array are read out row by row, pixel cells in a row which is read out last must store photo-generated charge in their respective storage devices longer than pixel cells in earlier read rows. The conventionally used storage devices may lose charge over time, and the longer the conventional storage devices must store photo-generated charge, the more charge is lost. Therefore, charge loss is especially problematic for pixel cells in a last read row. When charge is lost by a pixel cell, the resultant image may have a poor quality or be distorted.

Additionally, in conventional pixel cells, potential barriers may exist in the path of the photo-generated charge as it is transferred from the photo-conversion device to readout circuitry. Such potential barriers may prevent a portion of the photo-generated charge from reaching the readout circuitry, thereby reducing the charge transfer efficiency of the pixel cell and also reducing the quality of a resultant image. Accordingly, what is needed is a pixel cell with an electrical shutter having improved charge transfer efficiency and minimal charge loss.

BRIEF SUMMARY OF THE INVENTION

Embodiments of the invention provide an improved pixel cell with increased charge transfer efficiency and low charge loss. A pixel cell comprises a photo-conversion device for generating charge and a gate controlled charge storage region for storing photo-generated charge under control of a control gate. The charge storage region is adjacent to a gate of a transistor. The transistor gate is adjacent to the photo-conversion device and, in conjunction with the control gate, transfers photo-generated charge from the photo-conversion device to the charge storage region.

DETAILED DESCRIPTION OF THE INVENTION

Figure 1:
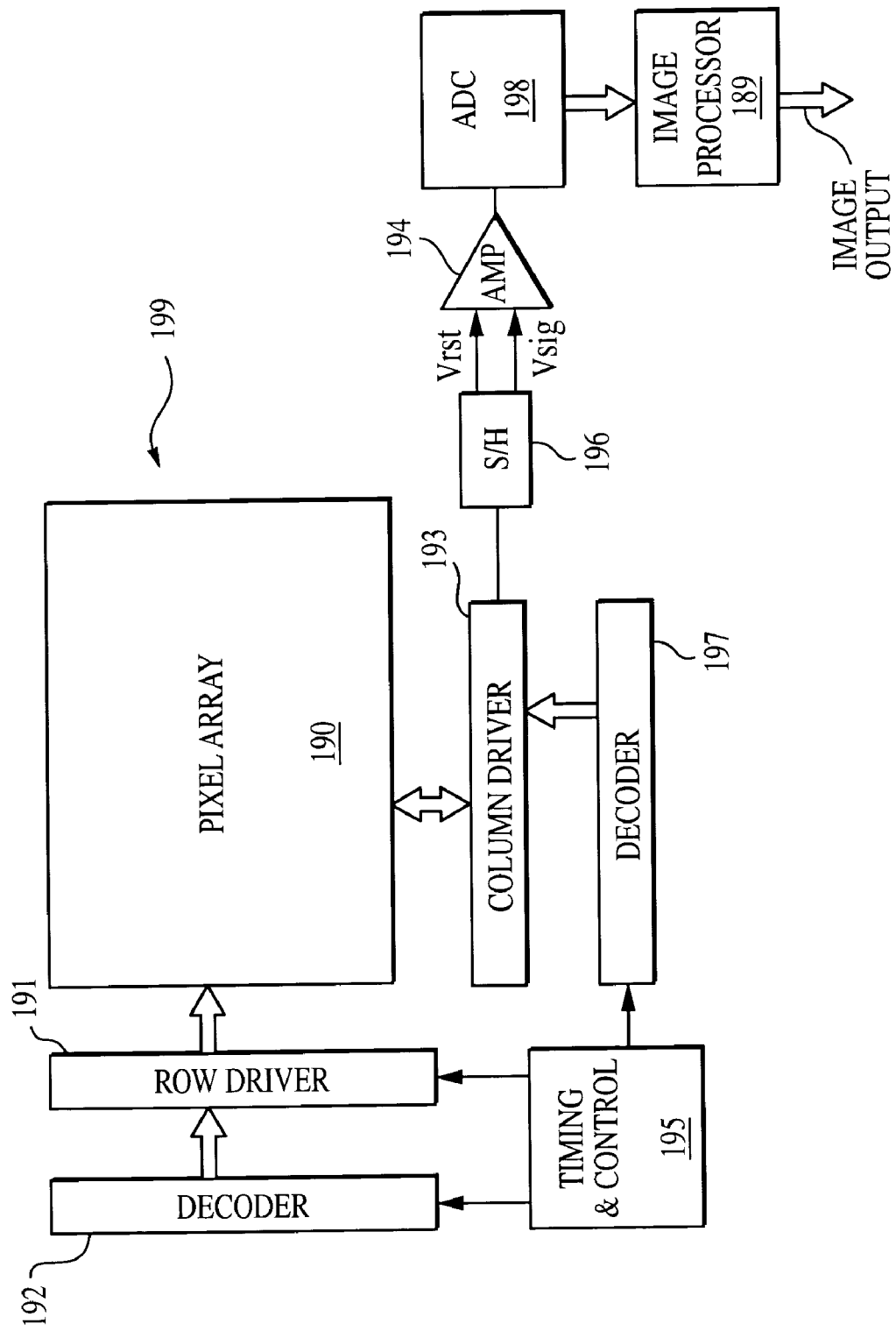
FIG. 1 is a block diagram of a conventional image sensor.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an image sensor will proceed concurrently in a similar fashion.

Figure 2A:
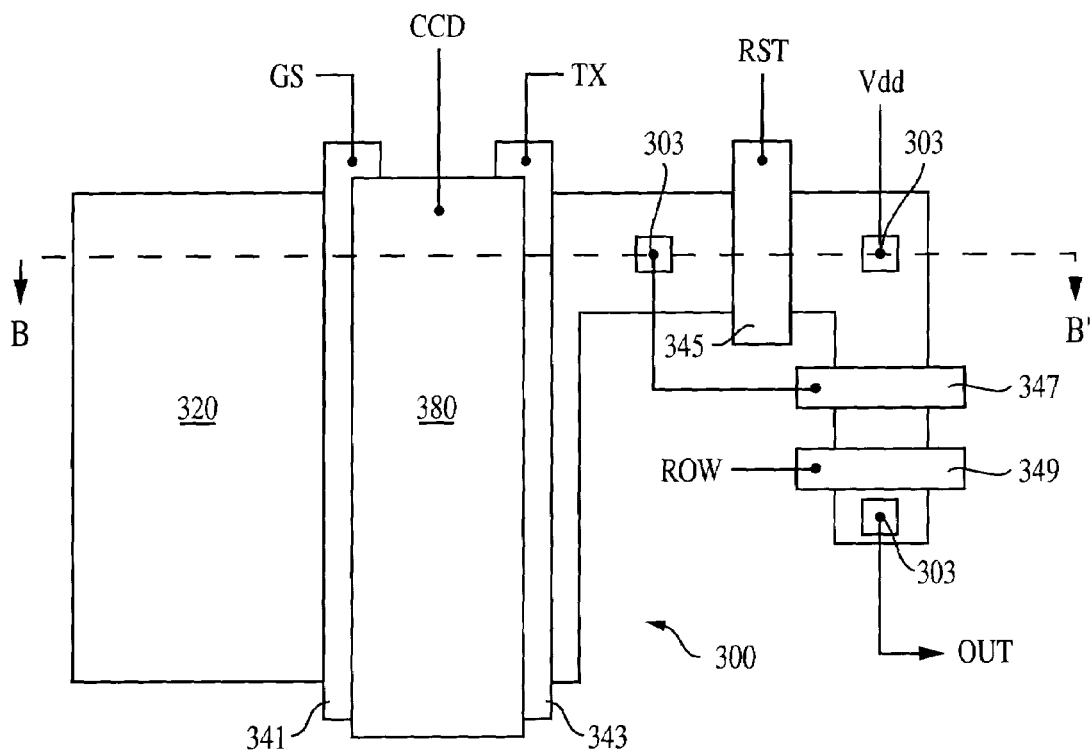
FIG. 2A is a top plan view of a pixel cell according to an embodiment of the invention.
Figure 2B:
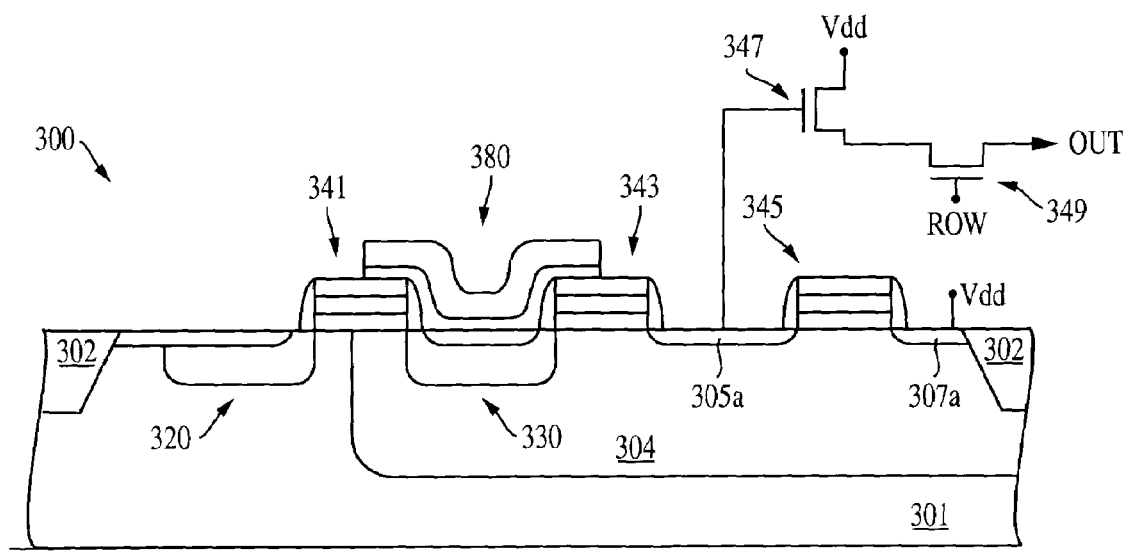
FIG. 2B is a cross-sectional view of the pixel cell of FIG. 2 along line BB'.

Referring to the drawings, FIG. 2A is a top plan view of a pixel cell 300 according to an exemplary embodiment of the invention and FIG. 2B is a cross-sectional view of the pixel cell 300 along line BB'. For exemplary purposes pixel cell 300 is shown as a five-transistor (5T) pixel cell 300, but the invention is not limited to a pixel cell having a specific number of transistors and embodiments having other numbers of transistors are possible.

Pinned photodiode 320 is a photo-conversion device for accumulating photo-generated charge. Adjacent to the pinned photodiode 320 is a gate 341 of a shutter transistor for determining an integration time for the pixel cell 300 and for transferring charge from the pinned photodiode 320 to a charge storage region. For exemplary purposes the shutter gate 341 is a global shutter gate, which operates at a same time as shutter gates of other pixels in an image sensor so that all pixels have equal and concurrent integration times. The invention, however, is not limited to global shuttering techniques and other shuttering techniques may be used as well.

In the illustrated exemplary embodiment of the invention, there is a storage device, which is a single CCD stage. Typically, a CCD stage is a metal oxide semiconductor (MOS) capacitor. A MOS capacitor can be generally described as a capacitor formed by a metal or other conductive material and a semiconductor material separated by an insulating material. Typically, the conductive material serves as a gate of the MOS capacitor.

Illustratively, the CCD stage is shown as a buried channel CCD stage 330 having a CCD gate 380, which is shown partially overlapping both the shutter gate 341 and a transfer gate 343. CCD gate 380 controls the CCD stage 330 and helps to transfer charge to the CCD stage 330 in conjunction with the global shutter gate. CCD stage 330 stores the charge until the charge is transferred to a sensing node, which is preferably a floating diffusion region 305, to be read out. Prior to readout, the charge is transferred via the CCD gate 380 and a transfer gate 343 to the floating diffusion region 305.

CCD stage 330 provides increased charge transfer efficiency for the pixel cell 300 over a conventional pixel cell. As is known in the art, a CCD is capable of providing almost complete charge transfer. Accordingly, almost no charge will be lost when transferred from the pinned photodiode 320 to the floating diffusion region 305 and the pixel cell 300 will have improved charge transfer efficiency. Additionally, the CCD stage 330 reduces charge loss while charge is stored in the CCD stage 330 over time. Near a surface of the substrate 301, charge carried by, for example, electrons may be lost when electrons recombine with holes. Because CCD stage 330 is a buried channel device, charge is maintained below the surface of the substrate 301 minimizing recombination and charge loss.

The floating diffusion region 305 is electrically connected to a reset transistor having a gate 345 and to a gate 347 of a source follower transistor. A source/drain region 307 of the reset transistor is connected to a supply voltage source $V_{dd}$. The reset transistor resets the floating diffusion region 305 to a fixed voltage, $V_{dd}$, before the floating diffusion region 305 receives photo-generated charge from the CCD stage 330. The source follower transistor receives at its gate 347 an electrical signal from the floating diffusion region 305. The source follower transistor is also connected to a row select transistor having a gate 349 for outputting a signal from the source follower transistor to a column readout line in response to a signal on a row select line.

Figure 3:
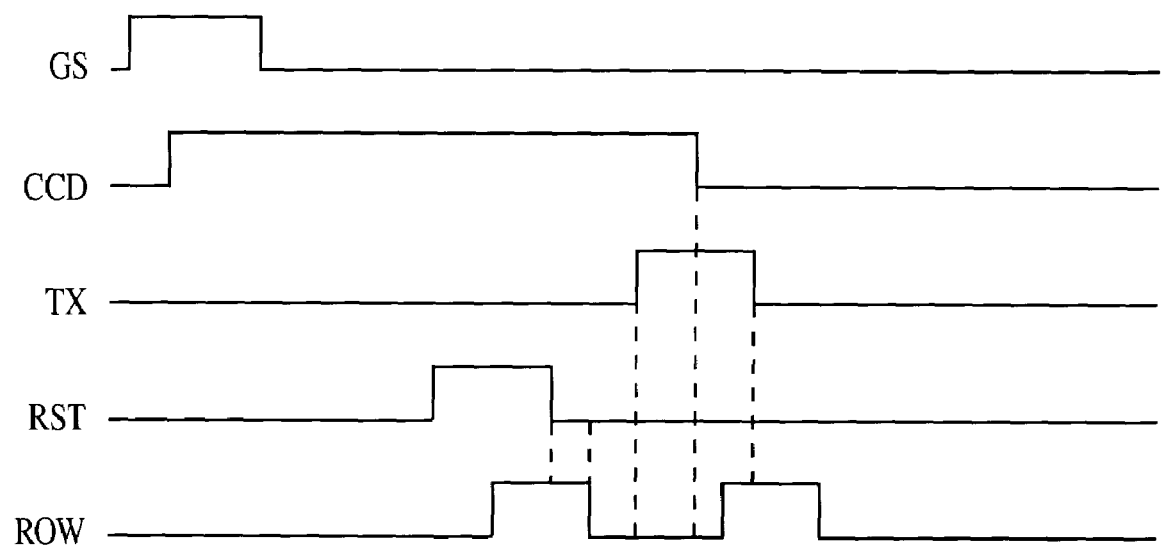
FIG. 3 is an exemplary timing diagram for an image sensor according to an embodiment of the invention.
Figure 4A:
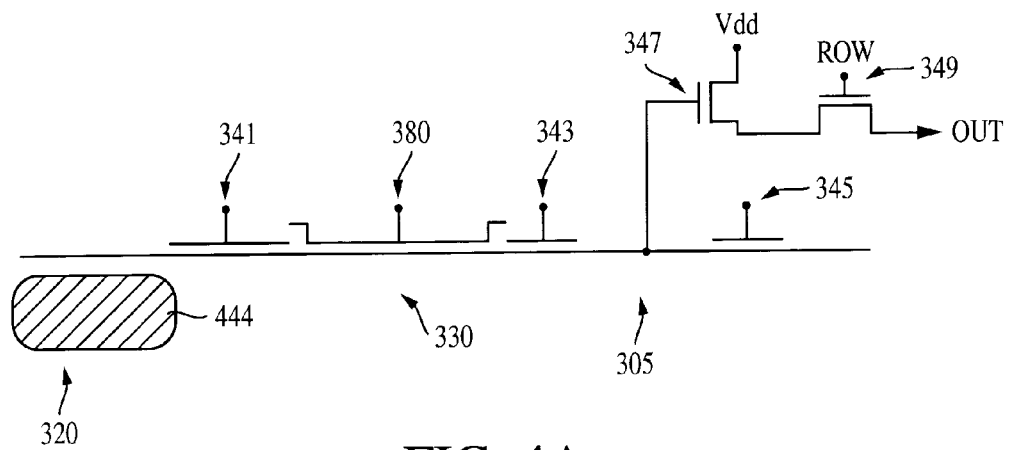
FIG. 4A is a schematic diagram illustrating the location of photo-generated charge at a stage of operation of the pixel cell of FIG. 2.
Figure 4B:
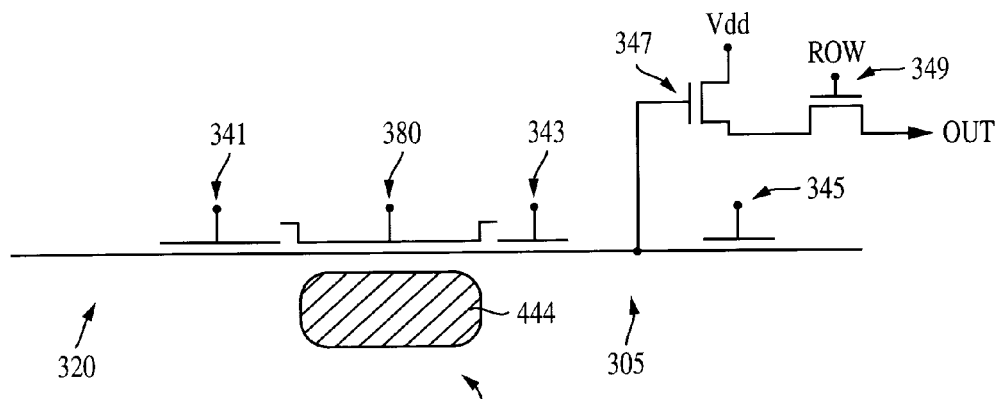
FIG. 4B is a schematic diagram illustrating the location of photo-generated charge at a stage of operation of the pixel cell of FIG. 2.
Figure 4C:
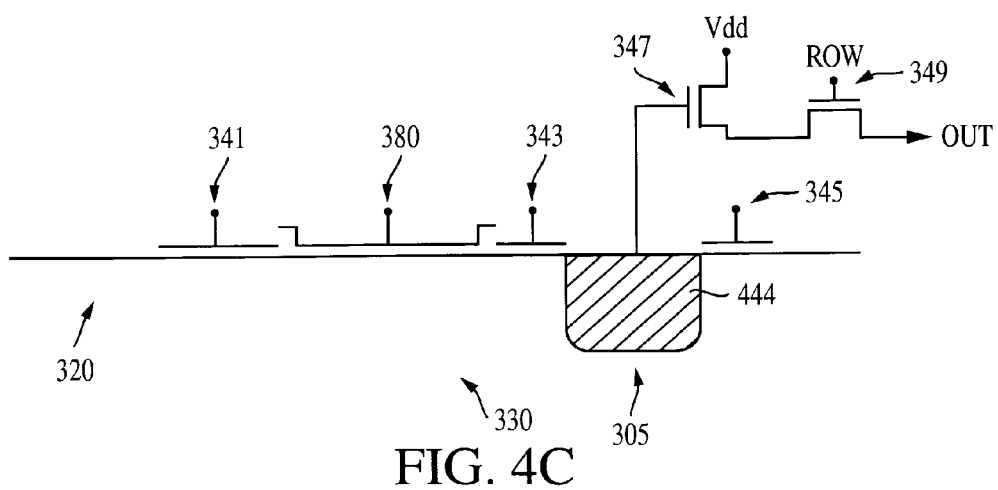
FIG. 4C is a schematic diagram illustrating the location of photo-generated charge at a stage of operation of the pixel cell of FIG. 2.

FIG. 3 is an exemplary timing diagram representing the operation of a pixel cell 300 (FIGS. 2A–2B) according to an embodiment of the invention. FIGS. 4A–4C illustrate the location of photo-generated charge 444 at stages of operation of pixel cell 300. As shown in FIG. 2A, gate 341 receives global shutter (GS) signals, CCD gate 380 receives charge coupled device (CCD) signals, gate 343 receives transfer (TX) signals, gate 345 receives reset (RST) signals, and gate 349 receives row (ROW) signals. All of these signals could be provided with circuitry as in FIG. 1, by appropriate modification of timing and control circuitry 195, which controls these signals. Supply voltage $V_{dd}$ and other connections for gate 347 and for readout are made at connection points 303.

Prior to the occurrence of signals shown in FIG. 3, the pinned photodiode 320 collects photo-generated charge 444 in response to external incident light, as shown in FIG. 4A. After an integration time, a global shutter (GS) signal is pulsed high causing the gate 341 of the shutter transistor to turn on and transfer the photo-generated charge 444 from the pinned photodiode 320 to the CCD stage 330. Also at this time, a CCD signal is pulsed high to turn on CCD gate 380. The CCD signal stays high and CCD gate 380 remains on to store the charge 444 in the CCD stage 330, as shown in FIG. 4B.

While the charge 444 is stored by the CCD stage 330, a RST signal is pulsed high causing the gate 345 of the reset transistor to turn on to reset the floating diffusion region 305 to $V_{dd}$. Also at this time, a ROW signal turns on the gate 439 of the row select transistor. The reset voltage on the floating diffusion region 305 is applied to the gate of the source follower transistor to provide a current based on the reset voltage which passes through the row select transistor to a column line. This current is translated into a reset voltage, $V_{rst}$, by readout circuitry (not shown) and read out. When readout is completed, the RST and ROW signals transition to low.

Next, a TX signal is pulsed high and the CCD signal remains high, to transfer the photo-generated charge 444 from the CCD stage 330 to the floating diffusion region 305. Once the charge 444 is transferred to the floating diffusion region 305, as shown in FIG. 4C, the TX and CCD signals pass to low.

Also, at this time a ROW signal again turns on the gate 349 of the row select transistor. The photo-generated charge 444 on floating diffusion region 305 is applied to the gate of the source follower transistor to control the current passing through row select transistor. This current is similarly translated into a voltage, $V_{sig}$, and read out. When a signal indicating the photo-generated charge 444 from the floating diffusion region 305 is read out, the ROW signal transitions to low.

The fabrication of pixel cell 300 is described below with reference to FIGS. 5A through 5K. No particular order is required for any of the actions described herein, except for those logically requiring the results of prior actions. Accordingly, while the actions below are described as being performed in a general order, the order is exemplary only and may be altered.

Figure 5A:
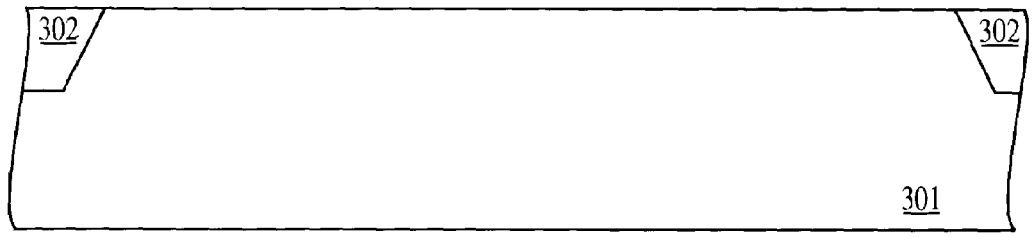
FIG. 5A is a cross-sectional view of the pixel cell of FIG. 2 at an initial stage of fabrication.

FIG. 5A illustrates a pixel cell 300 at an initial stage of fabrication. Substrate 301, is illustratively of a first conductivity type, which, for this exemplary embodiment is p-type. Isolation regions 302 are formed in the substrate 301 and filled with a dielectric material. The dielectric material may be an oxide material, for example a silicon oxide, such as SiO or $SiO_2$; oxynitride; a nitride material, such as silicon nitride; silicon carbide; a high temperature polymer; or other suitable dielectric material. As shown in FIG. 5A, the isolation region 302 can be a shallow trench isolation (STI) region and the dielectric material is preferably a high density plasma (HDP) oxide, a material which has a high ability to effectively fill narrow trenches.

Figure 5B:
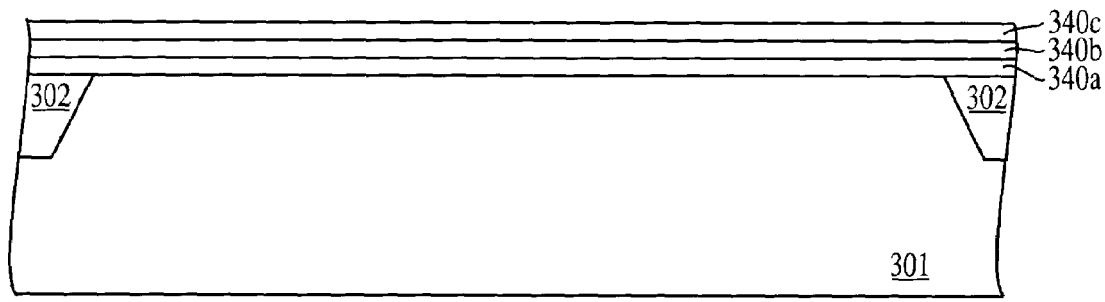
FIG. 5B is a cross-sectional view of the pixel cell of FIG. 2 at an intermediate stage of fabrication.
Figure 5C:
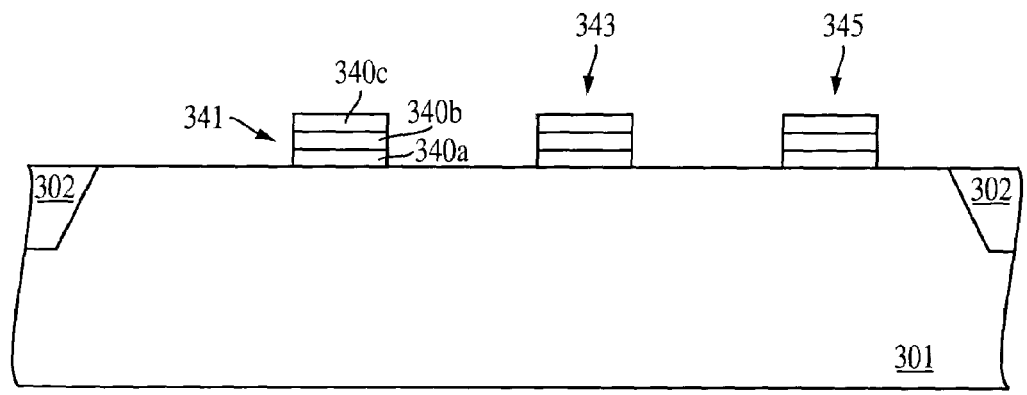
FIG. 5C is a cross-sectional view of the pixel cell of FIG. 2 at an intermediate stage of fabrication.

As shown in FIG. 5B, a first insulating layer 340a of silicon oxide is grown or deposited on the substrate 301. The layer 340a will be the gate oxide layer for the subsequently formed transistor gates. First insulating layer 340a may have a thickness of approximately 50 Angstroms (Å). Next, a layer of conductive material 340b is deposited over the oxide layer 340a. The conductive layer 340b will serve as the gate electrode for the subsequently formed transistors. Conductive layer 340b may be a layer of polysilicon, which may be doped to a second conductivity type, e.g. n-type, and may have a thickness of approximately 1000 Å. A second insulating layer 340c is deposited over the polysilicon layer 340b. The second insulating layer 340c may be formed of an oxide ($SiO_2$), a nitride (silicon nitride), an oxynitride (silicon oxynitride), ON (oxide-nitride), NO (nitride-oxide), or ONO (oxide-nitride-oxide). Second insulating layer 340c may have a thickness of approximately 1000 Å.

The layers, 340a, 340b, and 340c, may be formed by conventional deposition methods, such as chemical vapor deposition (CVD) or plasma chemical vapor deposition (PECVD), among others. The layers 340a, 340b, and 340c are then patterned and etched to form the multilayer gate stack structures 341, 343, and 345 shown in FIG. 5C. The gate stack 341 is the gate structure for a global shutter transistor, the gate stack 343 is the gate structure for a transfer transistor, and gate stack 345 is the gate structure for a reset transistor.

The invention is not limited to the structure of the gates 341, 343, and 345 described above. Additional layers may be added or the gates 341, 343, and 345 may be altered as is desired and known in the art. For example, a silicide layer (not shown) may be formed between the gate electrodes 340b and the second insulating layers 340c. The silicide layer may be included in the gates 341, 343, and 345, or in all of the transistor gate structures in an image sensor circuit, and may be titanium silicide, tungsten silicide, cobalt silicide, molybdenum silicide, or tantalum silicide. This additional conductive layer may also be a barrier layer/refractor metal, such as TiN/W or $W/N_x/W$, or it could be formed entirely of $WN_x$.

Figure 5D:
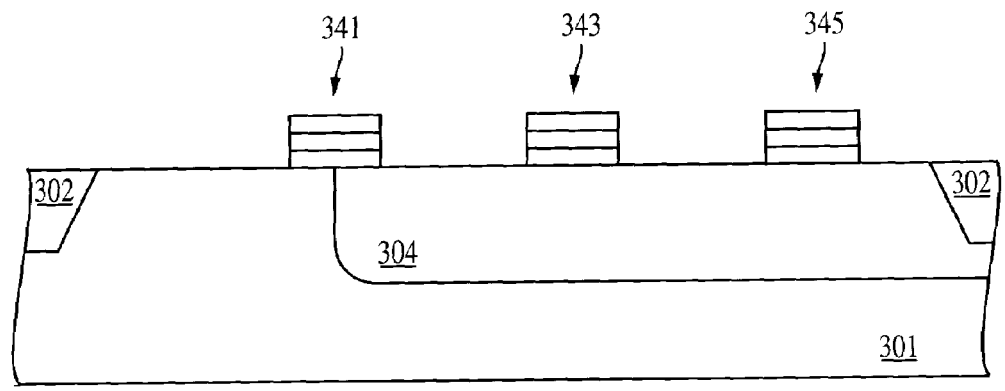
FIG. 5D is a cross-sectional view of the pixel cell of FIG. 2 at an intermediate stage of fabrication.

A p-well 304 is implanted into substrate 301 as shown in FIG. 5D. P-well 304 is formed in the substrate 301 from a point below the shutter gate 341 to a point below the STI region 302 that is on a side of the reset gate 345 opposite to the transfer gate 343. P-well 304 may be formed by known methods. For example, a layer of photoresist (not shown) may be patterned over the substrate 301 having an opening over the area where p-well 304 is to be formed. A p-type dopant, such as boron, may be implanted into the substrate through the opening in the photoresist. Illustratively, the p-well 304 is formed having a p-type dopant concentration that is higher than adjacent portions of the substrate 301.

Figure 5E:
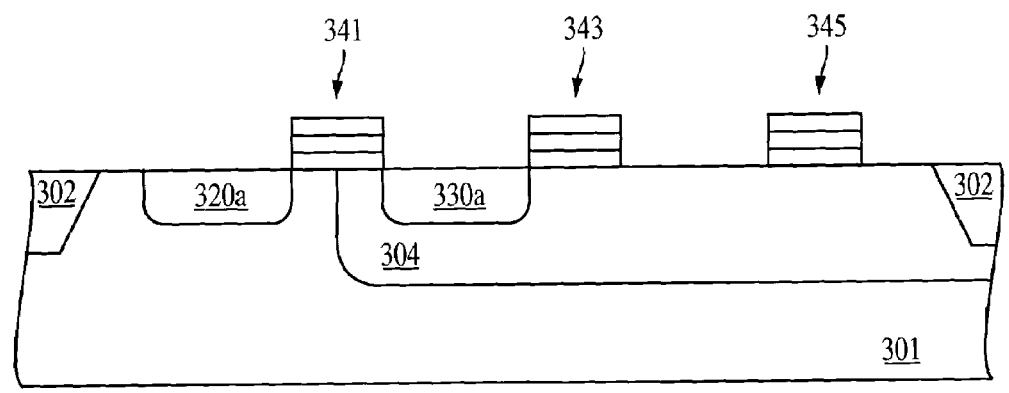
FIG. 5E is a cross-sectional view of the pixel cell of FIG. 2 at an intermediate stage of fabrication.

Doped regions 320a and 330a of a second conductivity type are implanted in the substrate 301 for the pinned photodiode 320 and CCD stage 330, respectively, as shown in FIG. 5E. Pinned photodiode region 320a, and CCD stage region 330a are illustratively lightly doped n-type regions. The pinned photodiode and CCD stage regions 320a and 330a may be formed by methods known in the art. For example, a layer of photoresist (not shown) may be patterned over the substrate 301 having an opening over the surface of the substrate 301 where the pinned photodiode and CCD stage regions 320a and 330a are to be formed. An n-type dopant, such as phosphorus, arsenic, or antimony, is implanted through the opening and into the substrate 301. Multiple implants may be used to tailor the profile of the regions 320a and 330a. If desired, an angled implantation may be conducted to form the pinned photodiode and CCD stage regions 320a and 330a, such that implantation is carried out at angles other than 90 degrees relative to the surface of the substrate 301.

The pinned photodiode region 320a is on an opposite side of the shutter gate 341 from the CCD stage region 330a and is approximately aligned with an edge of the shutter gate 341 forming a photosensitive charge accumulating region for collecting photo-generated charge. The CCD stage region 330a is between and approximately aligned with an edge of the shutter gate 341 and an edge of the transfer gate 343 forming a storage region for storing photo-generated charge.

Figure 5F:
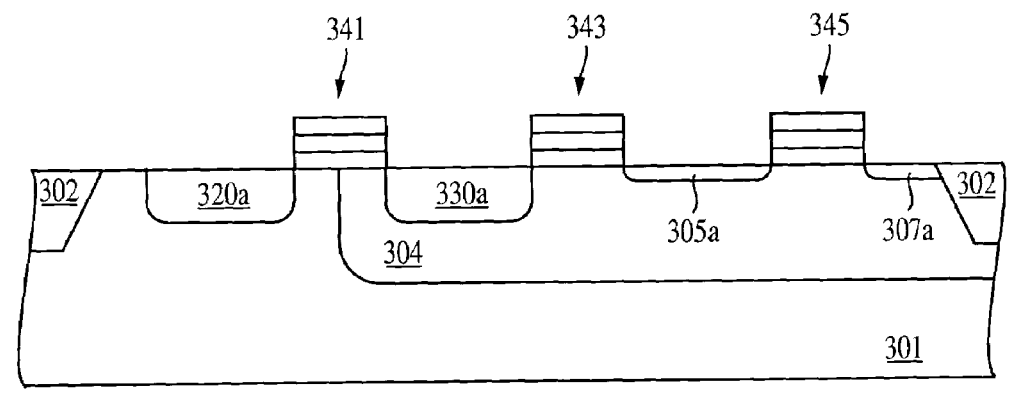
FIG. 5F is a cross-sectional view of the pixel cell of FIG. 2 at an intermediate stage of fabrication.

As shown in FIG. 5F, lightly doped drain (LDD) implants are performed by known techniques to provide LDD regions 305a and 307a. LDD region 305a is implanted between transfer gate 343 and reset gate 345 and is approximately aligned with respective edges of transfer gate 343 and reset gate 345. LDD region 307a is also approximately aligned with an edge of the reset gate 345, but is implanted adjacent to the reset gate 345 on a side of the reset gate 345 opposite to the transfer gate 343. For exemplary purposes LDD regions 305a and 307a are lightly doped n-type regions.

Figure 5G:
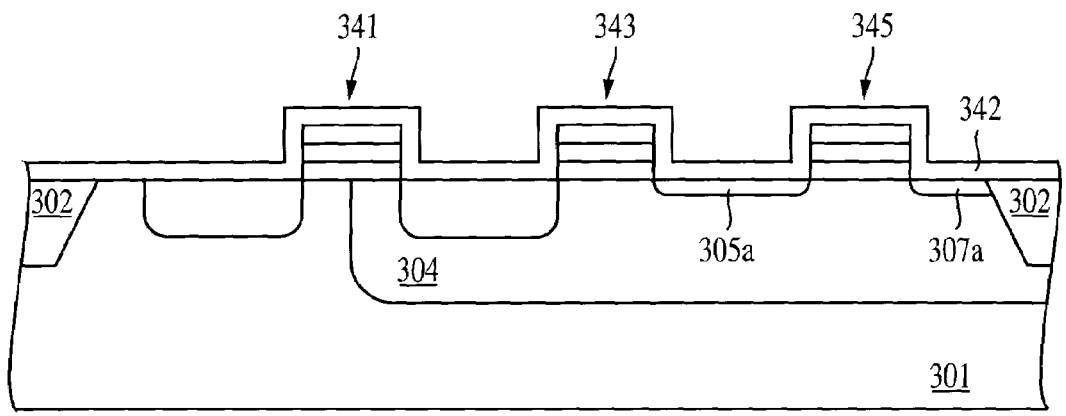
FIG. 5G is a cross-sectional view of the pixel cell of FIG. 2 at an intermediate stage of fabrication.

FIG. 5G depicts the formation of a layer 342, which will subsequently form sidewall spacers on the sidewalls of the gates 341, 343, and 345. Illustratively, layer 342 is an oxide layer, but layer 342 may be any appropriate dielectric material, such as silicon dioxide, silicon nitride, an oxynitride, ON, NO, ONO, or TEOS, among others, formed by methods known in the art. Layer 342 may have a thickness of approximately 700 Å.

Figure 5H:
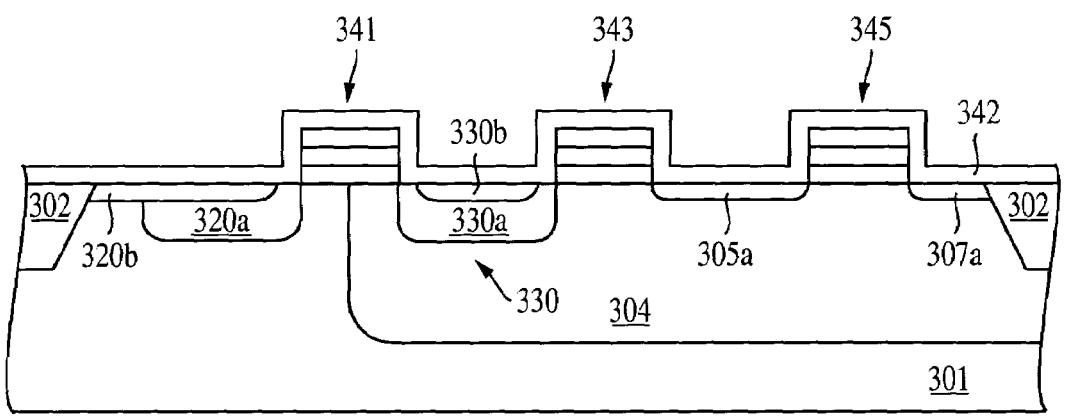
FIG. 5H is a cross-sectional view of the pixel cell of FIG. 2 at an intermediate stage of fabrication.

Doped surface layers 320b and 330b for the pinned photodiode 320 and the CCD stage 330, respectively, are implanted, as illustrated in FIG. 5H. Doped surface layers 320b and 330b are doped to a first conductivity type, which for exemplary purposes is p-type. Doped surface layers 320b and 330b may be highly doped p+ surface layers. A p-type dopant, such as boron, indium, or any other suitable p-type dopant, may be used to form p+ surface layers 320b and 330b.

The p+ surface layers 320b and 330b may be formed by known techniques. For example, layers 320b and 330b may be formed by implanting p-type ions through openings in a layer of photoresist. Alternatively, layers 320b and 330b may be formed by a gas source plasma doping process, or by diffusing a p-type dopant into the substrate 301 from an in-situ doped layer or a doped oxide layer deposited over the area where layers 320b and 330b are to be formed.

Figure 5I:
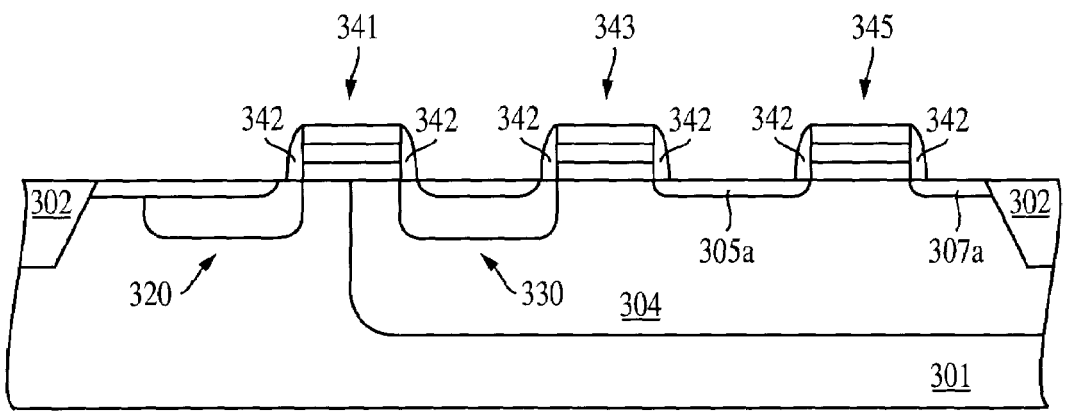
FIG. 5I is a cross-sectional view of the pixel cell of FIG. 2 at an intermediate stage of fabrication.

As shown in FIG. 5I, a dry etch step is conducted to etch the oxide layer 342, with the remaining parts of layer 342 forming sidewall spacers 342 on the sidewalls of gates 341, 343, and 345.

Figure 5J:
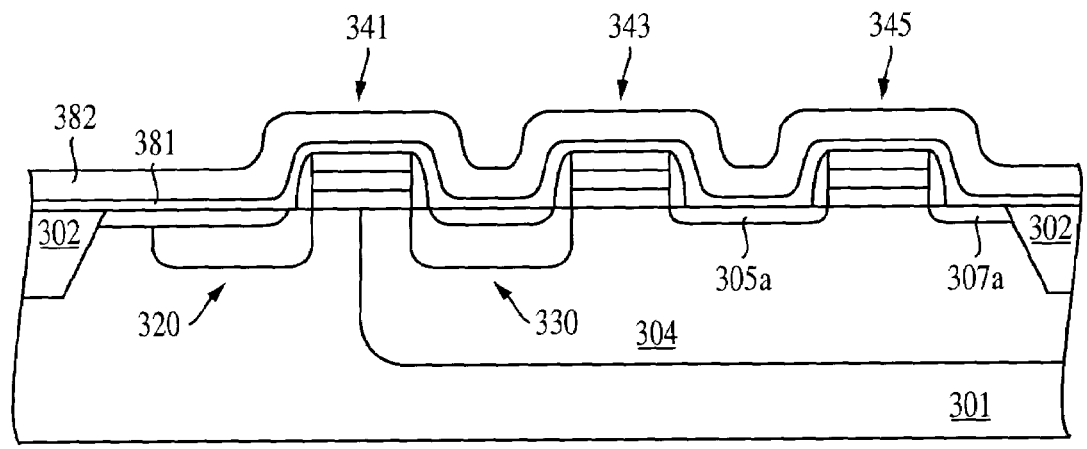
FIG. 5J is a cross-sectional view of the pixel cell of FIG. 2 at an intermediate stage of fabrication.

An insulating layer 381 is deposited by known methods over the substrate 301 and over gates 341, 343, and 345, as shown in FIG. 5J. Insulating layer 381 may have a thickness of approximately 100 Å. Illustratively, insulating layer 381 is a layer of silicon nitride ($Si_3N_4$), but other appropriate dielectric materials may be used.

Figure 5K:
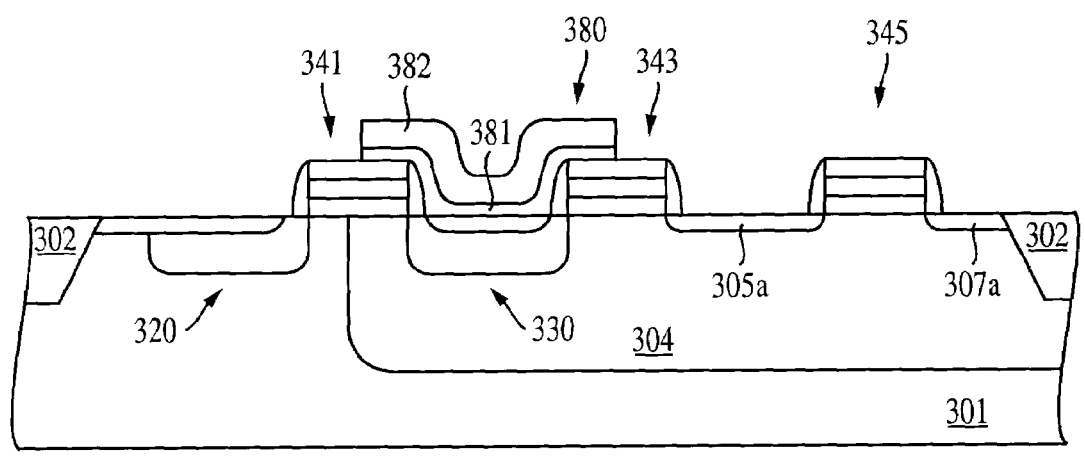
FIG. 5K is a cross-sectional view of the pixel cell of FIG. 2 at an intermediate stage of fabrication.

A conductive layer 382 is deposited by known methods over $Si_3N_4$ layer 381. Conductive layer 382 may have a thickness of approximately 1000 Å. Illustratively, conductive layer 381 is a layer of p-type polysilicon, but other appropriate conductive materials may be used. Layers 381 and 382 are patterned and etched to form CCD gate 380, as shown in FIG. 5K.

Source/drain regions 305 and 307 may be implanted by known methods to achieve the structure shown in FIG. 3B. Source/drain regions 305 and 307 are formed as regions of a second conductivity type, which for exemplary purposes is n-type. Any suitable n-type dopant, such as phosphorus, arsenic, or antimony, may be used to form source/drain regions 305 and 307. Source/drain region 305 is formed between transfer gate 343 and reset gate 345; and source/drain region 307 is formed adjacent to reset gate 345 on a side of reset gate 345 opposite to transfer gate 343.

Conventional processing methods may be used to complete the pixel cell 300. For example, insulating, shielding, and metallization layers to connect gate lines and other connections to the pixel cell 300 may be formed. Also, the entire surface may be covered with a passivation layer (not shown) of, for example, silicon dioxide, BSG, PSG, or BPSG, which is CMP planarized and etched to provide contact holes, which are then metallized to provide contacts. Conventional layers of conductors and insulators may also be used to interconnect the structures and to connect pixel cell 300 to peripheral circuitry.

While the above embodiments are described in connection with the formation of pnp-type photodiodes the invention is not limited to these embodiments. The invention also has applicability to other types of photodiodes and to photodiodes formed from npn regions in a substrate. If an npn-type photodiode is formed the dopant and conductivity types of all structures would change accordingly, with the transfer and shutter gates being part of PMOS transistors, rather than NMOS transistors as in the embodiments described above.

Although the invention is described in connection with a five-transistor (5T) pixel cell, the invention may also be incorporated into other CMOS pixel cell designs having different numbers of transistors. Without being limiting, such a design may include a six-transistor (6T) pixel cell. A 6T pixel cell differs from the 5T cell by the addition of a transistor, such as an anti-blooming transistor.

According to an embodiment of the invention, one or more pixel cells 300 as described above in connection with FIGS. 3–5K may be part of an array of pixel cells. Such an array may be part of an image sensor similar to the image sensor described above in connection with FIG. 1.

Figure 6:
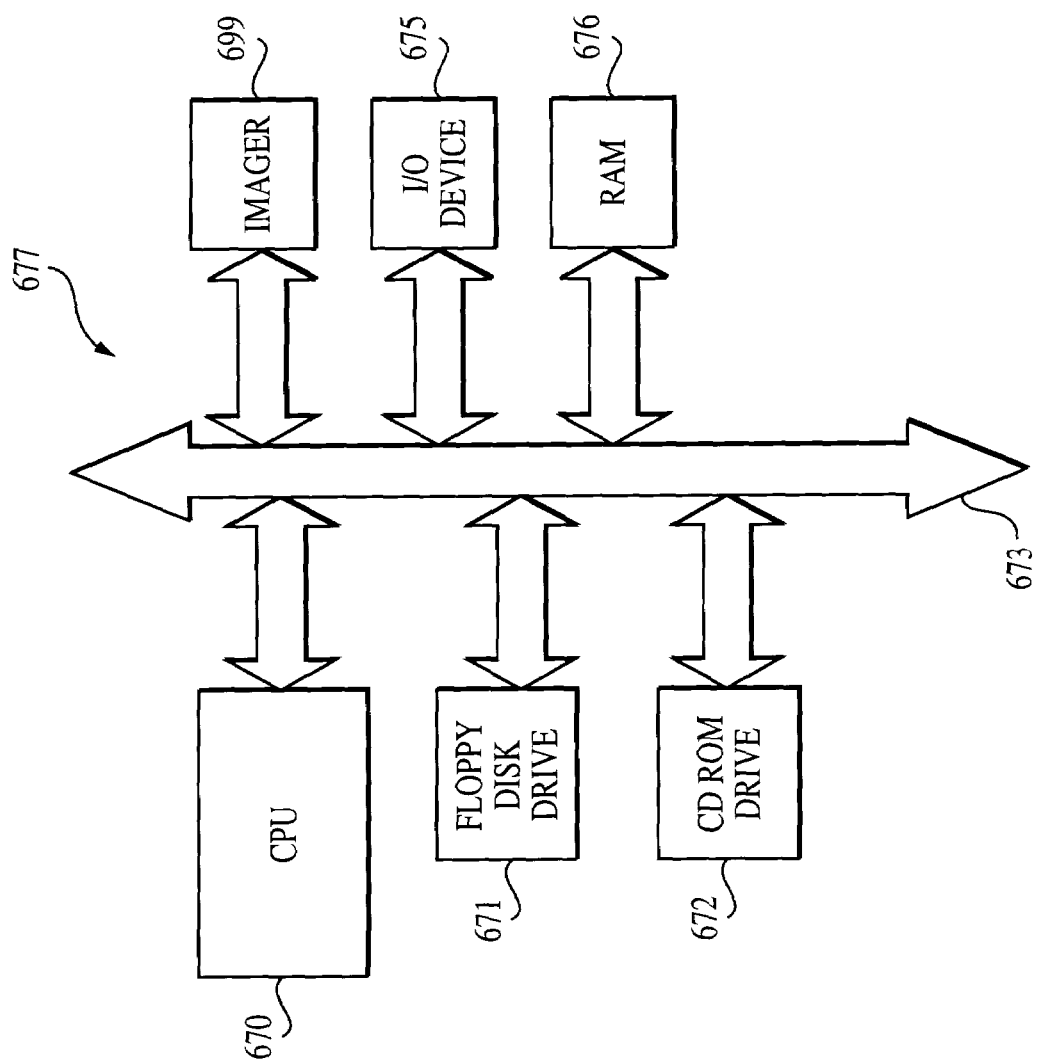
FIG. 6 is a schematic diagram of a processing system according to an embodiment of the invention.

FIG. 6 shows a typical processor-based system 677 including an image sensor 699 having an array of pixel cells, wherein one or more of the pixel cells are formed as described above in connection with FIGS. 3–5K. A processor-based system 677 is exemplary of a system having digital circuits that could include image sensors. Without being limiting, such a system could include a computer system, camera system, scanner, machine vision, vehicle navigation, video phone, surveillance system, auto focus system, star tracker system, motion detection system, image stabilization system, and data compression system.

Processor-based system 677, which for exemplary purposes is a computer system, generally comprises a central processing unit (CPU) 670, such as a microprocessor, that communicates with an input/output (I/O) device 675 over a bus 673. The image sensor 699, which produces an image output from a pixel array, also communicates with the system 677 over bus 673. The processor-based system 677 also includes random access memory (RAM) 676, and may include peripheral devices, such as a floppy disk drive 671 and a compact disk (CD) ROM drive 672, which also communicate with CPU 770 over the bus 673. The image sensor 699 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
   a photo-conversion device that generates charge;
   a gate controlled charge storage region that stores the charge under control of a control gate,
   a first transistor having its gate between the photo-conversion device and the charge storage region for transferring charge from the photo-conversion device to the charge storage region;
   a sensing node; and
   a second transistor having its gate between the charge storage region and the sensing node.

2. The pixel cell of claim 1, wherein the sensing node is a floating diffusion region.

3. The pixel cell of claim 1, wherein the control gate at least partially overlaps the first and second transistor gates.

4. A pixel cell comprising:
   a photo-conversion device that generates charge;
   a gate controlled charge storage region that stores the charge under control of a control gate, wherein the charge storage region comprises a doped region of a second conductivity type and a doped surface layer of a first conductivity type over and in contact with the doped region of a second conductivity type, and wherein the control gate is over the doped surface layer;
   a first transistor having its gate between the photo-conversion device and the charge storage region for transferring charge from the photo-conversion device to the charge storage region;
   a sensing node; and
   a second transistor having its gate between the charge storage region and the sensing node.

5. The pixel cell of claim 4, wherein the control gate overlaps the first and second transistor gates.

* * * * *